United States Patent [19]

O'Leary

[11] Patent Number: 4,771,159

[45] Date of Patent: Sep. 13, 1988

[54] METHOD OF SOLDERING LEADLESS COMPONENT CARRIERS OR THE LIKE

[75] Inventor: Daniel J. O'Leary, Natick, Mass.

[73] Assignee: GTE Government Systems Corporation, Waltham, Mass.

[21] Appl. No.: 54,696

[22] Filed: May 27, 1987

[51] Int. Cl.$^4$ ............................................. B23K 1/00
[52] U.S. Cl. ........................ 219/85 M; 219/85 BM; 219/85 H
[58] Field of Search .......... 219/85 BA, 85 BM, 85 H, 219/85 M, 85 R; 228/56.1, 56.3; 29/829, 832, 834, 840, 841

[56] References Cited

U.S. PATENT DOCUMENTS

| 3,597,285 | 8/1971 | Aronberg | 148/26 |
| 3,703,254 | 11/1972 | Maierson et al. | 228/56 |
| 4,235,649 | 11/1980 | Inamura et al. | 148/24 |
| 4,489,487 | 12/1984 | Bura | 29/840 |

FOREIGN PATENT DOCUMENTS

| 11507 | 5/1969 | Japan | 29/840 |
| 1266198 | 11/1986 | Japan | 219/85 H |
| 2049523 | 12/1980 | United Kingdom | 228/56.3 |
| 2096036 | 10/1982 | United Kingdom | 219/85 H |

Primary Examiner—Clifford C. Shaw
Attorney, Agent, or Firm—J. Stephen Yeo

[57] ABSTRACT

A method of soldering leadless component carriers or the like to printed circuit boards uses a solder paste containing copper spheres in addition to particulate solder and flux. The solder is melted and the copper spheres are embedded in the resulting solder matrix, offsetting the carrier from the printed circuit board.

2 Claims, 1 Drawing Sheet

METHOD OF SOLDERING LEADLESS COMPONENT CARRIERS OR THE LIKE

RELATED COPENDING APPLICATION

Ser. No. 07/054,697, issued as U.S. Pat. No. 4,731,130 on Mar. 15, 1988, Soldering Composition is concerned with a soldering composition suitable for practicing the method of the present application.

BACKGROUND OF THE INVENTION

This invention is concerned with a method of soldering devices to printed circuit boards.

Leadless component carriers are presently being used to increase component density on printed circuit boards as compared to that of leaded carriers. Leadless component carriers have electrical contacts nearly flush with the surface intended to be nearest the printed circuit board. It is known to be desirable to have this surface spaced somewhat (e.g., 10 mils) from the printed circuit board. This allows post soldering removal of flux residue and facilitates board cleaning. Furthermore, such a space tends to improve survival after thermal cycling.

Previous methods have used spacers or standoffs between the carrier and the board. One such technique is the placement of a dot of an organic material, such as an epoxy adhesive, under the carrier before soldering. Such materials, however, expand during thermal cycling, stressing the solder joint and increasing failure rates. Another method calls for placement of a removable spacer between the carrier and board, but this can cause missed solder joints because of a lack of contact between the component and solder paste, and requires hand soldering which is not cost-effective. Height and solder quality is operator sensitive.

Accordingly, an object of the invention is to provide a method of soldering leadless component carriers to printed circuit boards which automatically spaces the carrier from the board.

SUMMARY OF THE INVENTION

Briefly, there is provided according to one aspect of the invention a method of soldering leadless component carriers or the like to printed circuit boards.

A solder paste including particulate solder, flux, and solder plates copper powder, is screened onto a printed circuit board.

The solder paste is heated until the solder melts and flows, thereby soldering the leadless component carrier or the like to the printed circuit board.

DETAILED DESCRIPTION OF THE INVENTION

Figure 1:
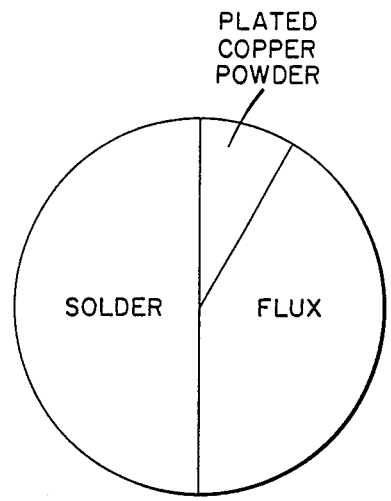
FIG. 1 is a graph representing the composition of a soldering paste used in the invention.
Figure 2:
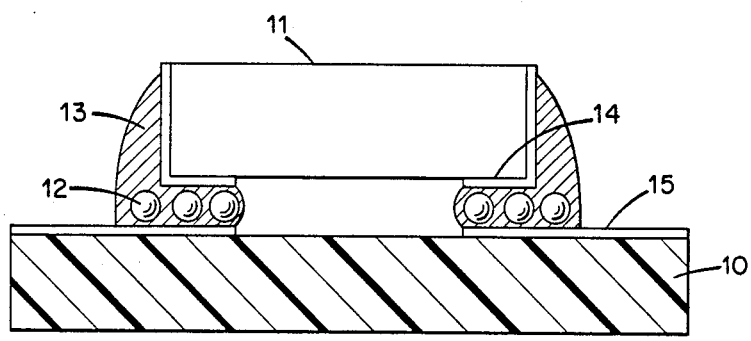
FIG. 2 is a schematic view of a leadless component carrier soldered to a printed circuit board in accordance with the method of the invention.

As a feature of the invention, a solder paste represented by the graph of FIG. 1, and including about 8% by weight of tin/lead plated copper powder, soldering flux, and tin/lead solder spheres is provided. The paste is screened or otherwise applied onto conductive strips 15 of printed circuit board 10, seen in FIG. 2. A leadless component carrier 11 or the like is mounted on board 10. The paste is then heated by vapor phase, infrared or other means until the solder spheres melt and flow, thereby soldering the leadless component carrier 11 to the printed circuit board 10. The copper powder 12 remains in a solder matrix 13 between the printed circuit board 10 and the carrier's contact 14 providing the desired offset.

Copper powder has been found to be the best spacer material. Glass tends to float in molten solder and gold is too brittle.

The copper powder preferably consists of copper spheres having a size in the range of 60 mesh to 180 mesh. The particles are cleaned and solder plated with a tin/lead eutectic having between 50 to 70 percent tin by weight.

The solder plated copper is mixed with particulate tin/lead solder in the form of spheres and flux to make a solder paste for practicing the invention.

It will be appreciated that modifications and variations to the method may be made by those skilled in the art. Therefore, the invention is to be defined by the scope of the claims.

I claim:

1. A method of soldering leadless component carriers to a printed circuit board comprising the steps of:
    (a) providing a solder paste including particulate solder, flux, and solder plated copper powder;
    (b) applying said solder paste to said printed circuit board;
    (c) mounting a leadless component carrier to said printed circuit board; and
    (d) heating said solder paste until the particulate solder melts and flows; thereby soldering said leadless component carrier to said printed circuit board, said copper powder remaining in the resulting solder matrix.

2. The method of claim 1 wherein said copper powder is in the form of copper spheres in the range of 60 mesh to 180 mesh.

* * * * *